(12) United States Patent
Grigoropoulos et al.

(10) Patent No.: US 6,635,932 B2
(45) Date of Patent: Oct. 21, 2003

(54) THIN FILM CRYSTAL GROWTH BY LASER ANNEALING

(75) Inventors: Costas P. Grigoropoulos, Berkeley, CA (US); Mutsuko Hatano, Palo Alto, CA (US); Ming-Hong Lee, Richmond, CA (US); Seung-Jae Moon, Albany, CA (US)

(73) Assignees: The Regents of the University of California, Oakland, CA (US); Hitachi America, Ltd., Brisbane, CA (US)

( * ) Notice: Subject to any disclaimer, the term of this patent is extended or adjusted under 35 U.S.C. 154(b) by 23 days.

(21) Appl. No.: 10/213,698

(22) Filed: Aug. 6, 2002

(65) Prior Publication Data

US 2003/0003636 A1 Jan. 2, 2003

Related U.S. Application Data

(62) Division of application No. 09/637,325, filed on Aug. 10, 2000.

(51) Int. Cl.$^7$ ................................................ H01L 23/62
(52) U.S. Cl. ..................................... 257/359; 257/548
(58) Field of Search .............................. 257/2, 47, 243, 257/359, 396, 408, 548

(56) References Cited

U.S. PATENT DOCUMENTS 6,113,689 A * 9/2000 Moon
6,316,338 B1   11/2001 Jung

FOREIGN PATENT DOCUMENTS

WO     WO97/45827 A1   12/1997

* cited by examiner

Primary Examiner—Phuc T. Dang
(74) Attorney, Agent, or Firm—Townsend and Townsend and Crew LLP

(57) ABSTRACT

A layer of material is transformed from a first state to a second state by the application of energy from an energy beam. For example, large direction- and location-controlled p-Si grain growth utilizes recrystallization of amorphous silicon from superpositioned laser irradiation. The superpositioned laser irradiation controls cooling and solidification processes that determine the resulting crystal structure. Specifically, a first laser beam of a first pulse duration is used to melt an amorphous silicon (a-Si) film and to create a temperature gradient. After an initial delay, a second laser beam with shorter pulse duration is superpositioned with the first laser beam. When a-Si is irradiated by the second laser beam, the area heated by the first laser beam becomes completely molten. Spontaneous nucleation is initiated in the supercooled liquid-Si when the liquid-Si temperature drops below the nucleation temperature. However, the central part of the liquid pool subjected to continued heating by the first laser beam cools down slowly. Grains nucleated in the periphery of the fully molten spot can therefore grow into the liquid-Si and extend in length until they collide at the center of the first laser beam spot. The first laser beam prolongs the molten Si phase and induces grain growth in a certain direction. The second laser beam triggers nucleation and controls grain location leading to subsequent lateral grain growth.

4 Claims, 11 Drawing Sheets

THIN FILM CRYSTAL GROWTH BY LASER ANNEALING

BACKGROUND OF THE INVENTION

The present invention generally relates to transformation of a material from a first state to a second state through the use of an applied energy beam. In one embodiment of the present invention, large grain polycrystalline silicon (p-Si) is formed from amorphous silicon by the superpositioned application of laser beams. Other embodiments of the present invention provide a method for manufacturing thin film transistors (TFTs) utilizing superpositioned laser annealing. Merely by way of example, the invention may be applied to the manufacture of TFTs for flat panel displays such as active matrix liquid crystal displays (AMLCDs), field emission displays (FEDs), and organic light emitting diode (O LED) displays. However, it would be recognized that methods in accordance with the present invention have a much broader range of applicability, including the formation of optical sensors.

Fabrication of high quality TFTs on transparent substrates is important for successful application of super-high-definition AMLCD technology. Excimer laser crystallization (ELC) is an efficient technology for obtaining high-performance p-Si TFTs for advanced flat panel display applications. In order to improve both the quality and uniformity of poly-Si TFT performance, the formation of high quality polycrystalline silicon films having carefully controlled grain size and location is often required. Pulsed laser crystallization of amorphous silicon (a-Si) films—usually effected by nanosecond, ultraviolet (UV) excimer laser radiation—has emerged as a promising new fabrication method. Laser annealing has been shown to be superior to other crystallization techniques because of its low fabrication cost and high efficiency. In addition, it is a low temperature processing technique because during the fast heating and cooling cycle the bulk substrate material is essentially unaffected, except within a submicron-thick thermal penetration zone adjacent to the heated film. This feature has important practical consequences, since it allows the use of inexpensive large area glass substrates, compared with more expensive quartz substrates capable of withstanding high temperature annealing.

ELC can produce grains of hundreds of nanometers in length depending on the a-Si film thickness and the sample preheating. However, the processing window is narrow because large grains can often only be obtained for laser pulse energy densities inducing near-complete melting. In the so-called superlateral growth regime, unmelted silicon particles in the vicinity of the film/substrate interface are thought to act as seeds for crystal growth in the lateral direction (i.e. parallel to the film surface).

Lateral crystal growth is important for improving electrical properties (e.g. electric field mobility) of the p-Si used by the TFT devices. Since the grains of p-Si are irregularly distributed, grain boundaries may deteriorate the electrical properties, reducing switching speed and increasing power consumption.

Therefore, a simple method and apparatus for easily transforming a layer of material from one state to another, for example from amorphous to polycrystalline, is desirable.

SUMMARY OF THE INVENTION

The present invention generally relates to transformation of a material from a first state to a second state, for example from amorphous to polycrystalline, through application of an energy beam. In one specific embodiment, large grain polycrystalline silicon (p-Si) is formed from amorphous silicon by the superpositioned application of laser beams. Embodiments of the present invention relate to large direction- and location-controlled p-Si grain growth utilizing recrystallization from superpositioned laser irradiation. The superpositioned laser irradiation controls cooling and solidification processes that determine the resulting crystal structure. Specifically, a first laser beam of a first pulse duration is used to melt an amorphous silicon (a-Si) film and to create a temperature gradient. After an initial delay, a second laser beam with shorter pulse duration is superpositioned with the first laser beam. When a-Si is irradiated by the second laser beam, the area heated by the first laser beam becomes completely molten. Spontaneous nucleation is initiated in the supercooled liquid-Si when the liquid-Si temperature drops below the nucleation temperature. However, the central part of the liquid pool that is subjected to continued heating by the first laser beam cools down slowly. Grains nucleated in the periphery of the fully molten spot can therefore grow into the liquid-Si and extend in length until they collide at the center of the first laser beam spot. The first laser beam prolongs the molten Si phase and induces grain growth in a certain direction. The second laser beam triggers nucleation and controls grain location leading to subsequent lateral grain growth.

One embodiment of a method in accordance with the present invention for fabricating a film of material comprises the steps of providing a layer of material, the layer of material being substantially of a first state and selected from a conductive material, a semiconductive material, or a dielectric material. A first energy beam is applied to the layer of material at a first time and for a first duration. A second energy beam is applied to the layer of material at a second time and for a second duration, the second time subsequent to the first time and the second duration expiring on or before the first duration, such that the layer of material is converted from the first state to a second state.

One embodiment of an apparatus for forming a film of material in accordance with the present invention comprises a first energy source emitting a first energy beam and a second energy source emitting a second energy beam. A first delivery element is configured to deliver the first beam to a position on an amorphous silicon film for a first duration; and a second delivery element is configured to deliver the second beam to the position after the first beam and for a second duration superpositioned within the first duration.

These and other embodiments of the present invention, as well as its advantages and features, are described in more detail in conjunction with the text below and attached figures.

BRIEF DESCRIPTION OF THE DRAWINGS

FIGS. 5A–5C show SEM images of a sample annealed by excimer laser radiation combined with Ar⁺ laser under a first set of conditions in accordance with an embodiment of the present invention.

DESCRIPTION OF THE SPECIFIC EMBODIMENTS

The present invention generally relates to transformation of a material from one state to another through the use of an applied energy beam. In particular, one embodiment of the present invention relates to large direction- and location-controlled p-Si grain growth utilizing recrystallization from superpositioned laser irradiation. The superpositioned laser irradiation controls cooling and solidification processes that determine the resulting crystal structure. Specifically, in one embodiment of a method in accordance with the present invention, a first laser beam of a first pulse duration is used to melt an amorphous silicon (a-Si) film and to create a temperature gradient. After an initial delay, a second laser beam with shorter pulse duration is superpositioned with the first laser beam. When a-Si is irradiated by the second laser beam, the area heated by the first laser beam becomes completely molten. Spontaneous nucleation is initiated in the supercooled liquid-Si when the liquid-Si temperature drops below the nucleation temperature. However, the central part of the liquid pool that is subjected to continued heating by the first laser beam cools down slowly. Grains nucleated in the periphery of the fully molten spot can therefore grow into the liquid-Si and extend in length until they collide at the center of the first laser beam spot. The first laser beam prolongs the molten Si phase and induces grain growth in a certain direction. The second laser beam triggers nucleation and controls grain location leading to subsequent lateral grain growth.

Figure 1:
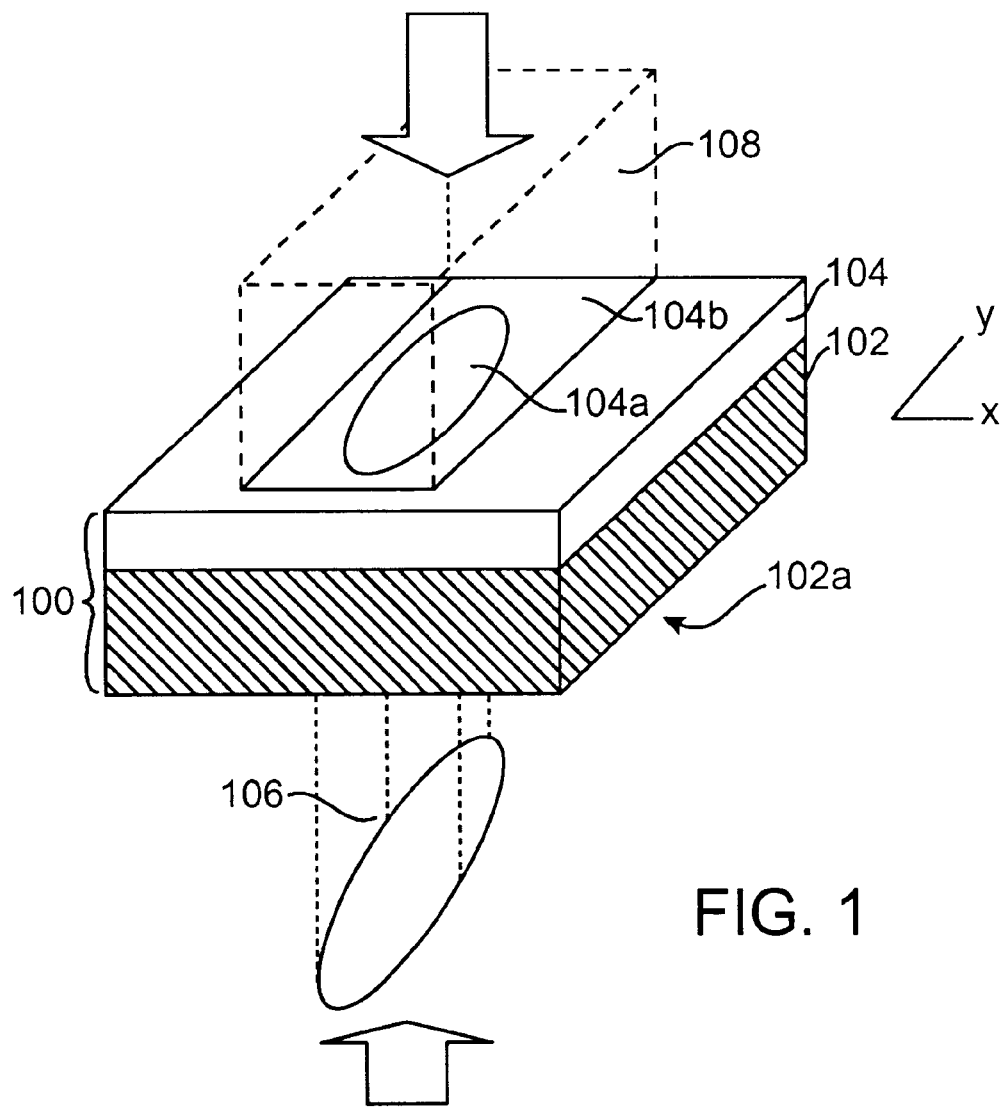
FIG. 1 shows a simplified perspective view of a method of laser annealing in accordance with one embodiment of the present invention.

FIG. 1 shows a perspective view of a laser annealing method in accordance with one embodiment of the present invention. Sample 100 includes an optically transparent substrate 102 bearing amorphous silicon film 104. First modulated and shaped laser beam 106 of wavelength 514.5 nm emitted from an Ar⁺ laser is applied to back side 102a of optically transparent substrate 102. Beam 106 is transmitted through optically transparent substrate 102 and heats elliptical region 104a of amorphous silicon film 104. While first laser beam 106 continues to irradiate amorphous silicon film 104, second laser beam 108 of wavelength 248 nm from pulsed KrF excimer laser is superpositioned on amorphous silicon film 104, heating second region 104b overlapping elliptical region 104a. Upon cessation of first laser beam 108 and cooling of the sample, long grain polycrystalline silicon crystals grow around the edge to the center of elliptical region 104.

Figure 2:
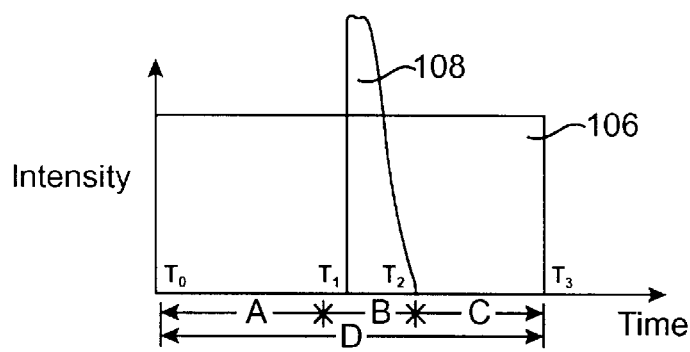
FIG. 2 plots intensity versus time for laser beams utilized in one embodiment of the present invention.

FIG. 2 presents a timing chart showing operation of one embodiment of the method in accordance with the present invention. At an initial time $T_0$, first laser beam 106 is applied to the back side of the transparent substrate and heats the amorphous silicon. Following a delay A of about 2 ms, at time $T_1$ second laser beam 108 is applied to the amorphous silicon. Second laser beam 106 irradiates the sample for a duration B of about 52 ns which expires at time $T_2$. First laser beam 106 then continues to irradiate the sample for a trailing time period C, but also expires at time $T_3$ such that irradiation by first beam 106 takes place over a total duration D of 4 ms.

Figure 3A:
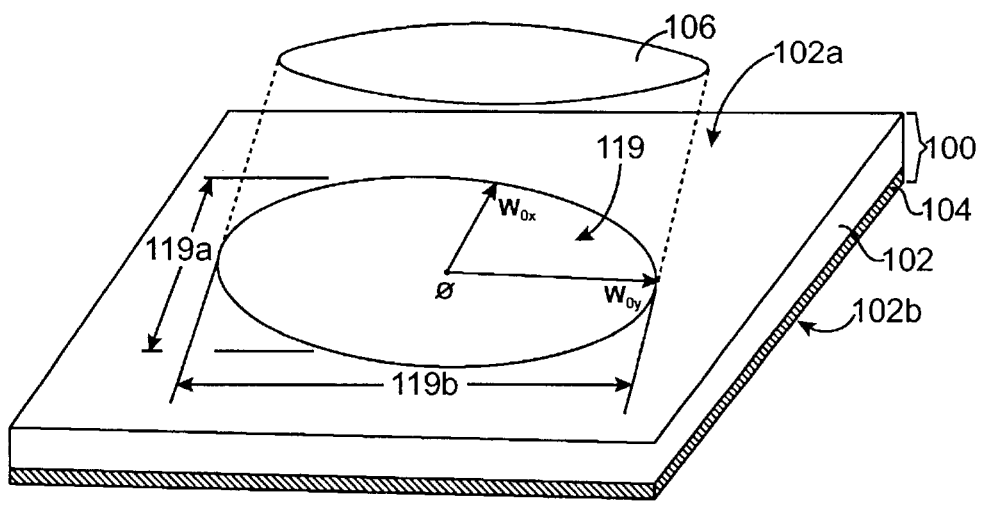
FIG. 3A illustrates the simplified elliptical cross-sectional profile of the $Ar^+$ laser beam applied to the backside of the sample.
Figure 3B:
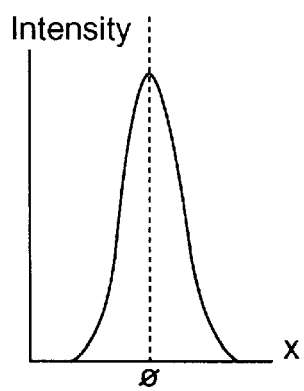
FIG. 3B plots beam intensity versus distance from the beam center along the minor axis (x-axis).
Figure 3C:
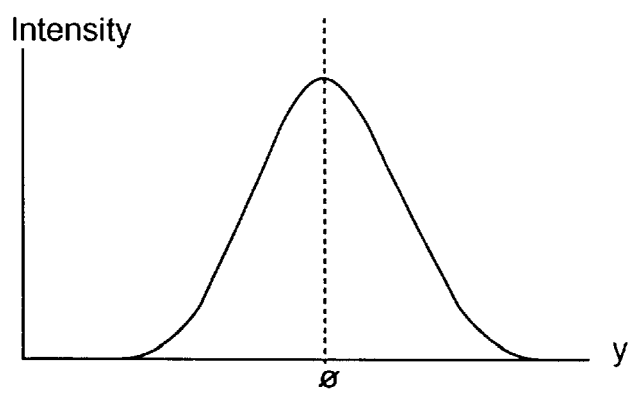
FIG. 3C plots beam intensity versus distance from the beam center along the major axis (y-axis).

FIGS. 3A–C illustrates the cross-sectional profile of Ar⁺ laser beam 106 delivered to back side 102a of sample 100. Specifically, FIG. 3A shows the $1/e^2$ irradiance focal beam shape about center 0 of elliptical beam cross-section 119. FIG. 3B plots beam intensity along minor axis 119a (the x-axis), and FIG. 3C plots beam intensity along minor axis 119b (the y-axis). The intensity of beam distribution of both FIGS. 3B and 3C is Gaussian.

A possible mechanism for the growth of long-grained silicon from amorphous silicon utilizing the method in accordance with the present invention is described in connection with FIGS. 4A–4C.

Figure 4A:
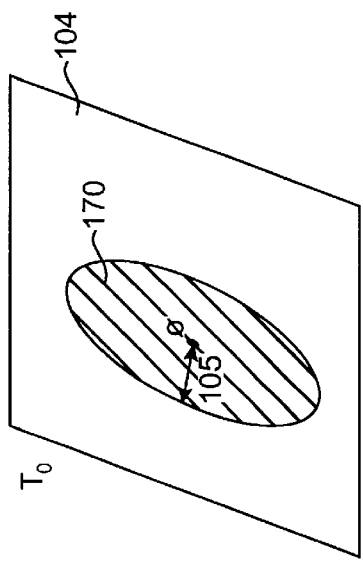
FIGS. 4A–4D show plan views illustrating a proposed simplified mechanism of crystal growth in accordance with an embodiment of the present invention.

FIG. 4A shows that at time $T_0$, the Ar⁺ laser beam is applied to the sample and transmitted through the substrate to amorphous silicon film 104, causing heating of the amorphous silicon in elliptical region 170. The Gaussian beam intensity profile described above in FIGS. 3B and 3C creates a corresponding temperature gradient 105 between edge 170a of elliptical region 170 and center 0 of elliptical region 170.

Figure 4B:
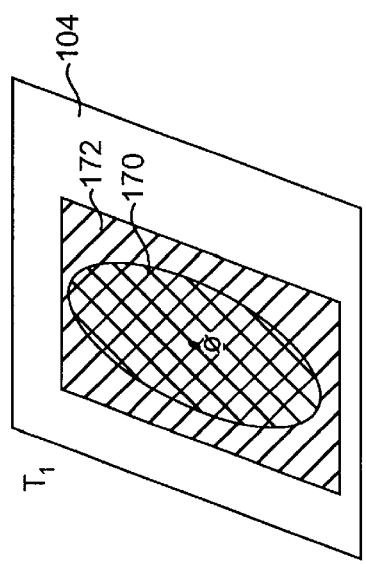

FIG. 4B shows that at time $T_1$, the excimer laser is applied to sample 100. Cross-section 172 of the excimer laser beam is superpositioned upon the heated elliptical region 170 created by the modulated pulse of Ar⁺ laser irradiation. When the amorphous silicon 104 is exposed to radiation from the excimer laser in this manner, silicon in elliptical region 170 becomes completely molten.

Figure 4C:
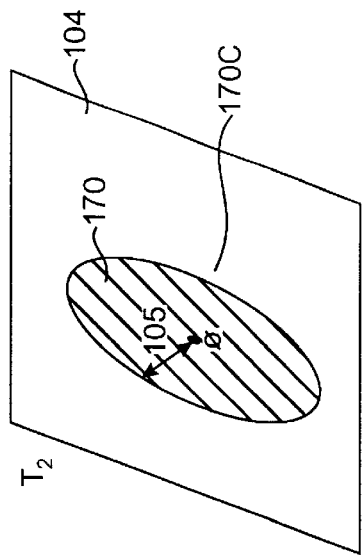
Figure 4D:
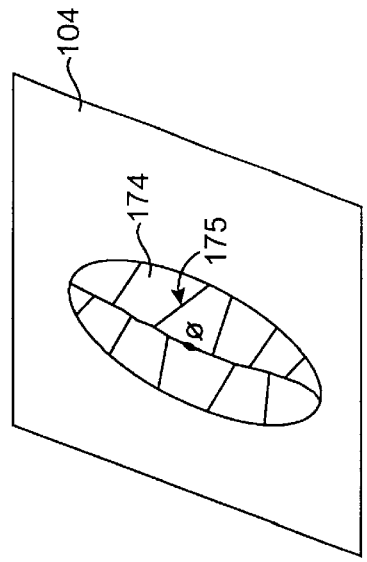

After a pulse duration of about 100 ns, FIG. 4C shows expiration of the excimer laser pulse at time $T_2$. Upon cessation of the excimer laser pulse, peripheral regions 170c outside of elliptical region 170 cool rapidly. Spontaneous nucleation and grain growth is initiated in the supercooled liquid in peripheral regions 170c when the temperature drops below the nucleation temperature. However, because of heating by Ar⁺ laser pulse having a longer pulse duration, silicon in elliptical region 170 cools less rapidly after cessation of the pulsed excimer laser beam. Polycrystalline silicon grains nucleated in peripheral regions 170c are therefore permitted to grow into the molten elliptical region 170, extending in length until crystals 174 having grain boundaries 175 from opposite edges meet in the center at center 0. This is shown in FIG. 4D.

The growth of long grain polycrystalline silicon crystals from amorphous silicon laser annealed in the manner described is supported by experimental results. FIGS. 5A–5C show scanning electron micrograph (SEM) images of samples annealed by excimer laser radiation of fluence 174 mJ/cm$^2$, occurring at approximately the 2 ms midpoint of a 4 ms duration of a pulse of Ar$^+$ laser radiation having a power of 938 mW. FIG. 5A is a large scale view illustrating three distinct regions of the annealed silicon: outer region 176a, middle region 176b, and inner region 176c. Middle region 176c should correspond to an outer wing of the Gaussian intensity profile of the modulated Ar$^+$ laser beam as shown in FIGS. 3B–C. Inner region 176c is composed of laterally-grown p-Si grains of significant length.

FIG. 5B shows a detail of boundary 176d between outer region 176a and middle region 176b. Outer region 176a consists of small grain size crystals evidencing partial melting of the amorphous silicon by the excimer laser pulse. Middle region 176b consists of microcrystalline silicon produced by excimer laser energy densities inducing complete melting of the amorphous silicon film.

FIG. 5C shows a detail of boundary 176e between the laterally grown polycrystalline silicon grains of inner region 176c and the surrounding middle microcrystalline region of middle region 176b. The polycrystalline silicon grains of inner region 176c extend to about 12 $\mu$m. The present invention is not limited to forming grains of this length, and may be used to form grains of any length preferably greater than 10 $\mu$m. Ultimately, the length of the polycrystalline silicon grains is determined by the size and intensity profile of the cross-section of the first laser beam.

Figure 6A:
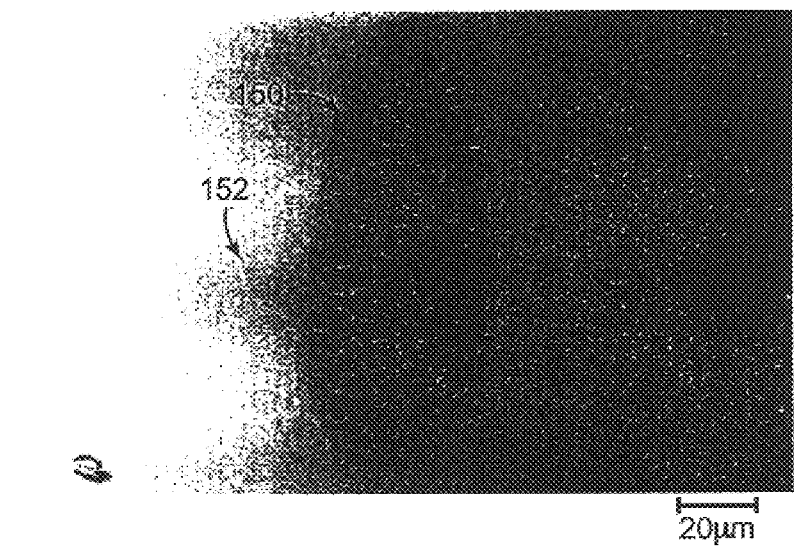
FIGS. 6A–6C show SEM images of samples annealed by excimer laser radiation combined with Ar⁺ laser under a second set of conditions in accordance with an embodiment of the present invention.
Figure 6B:
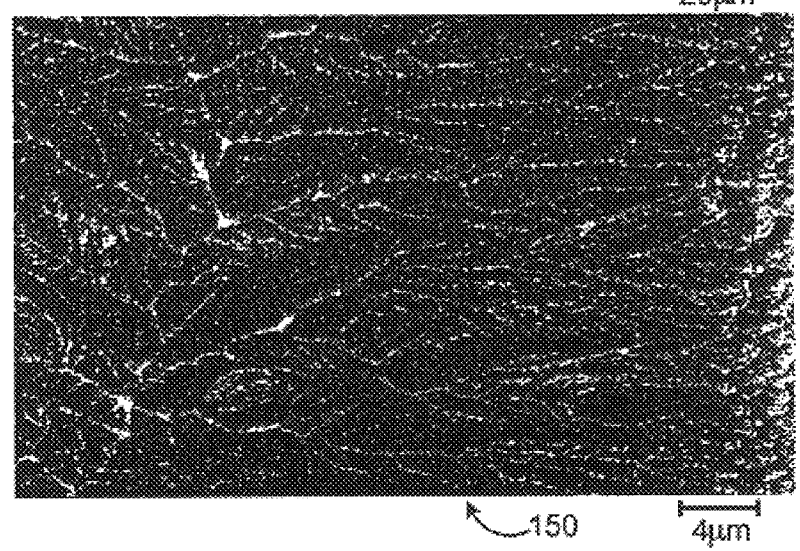
Figure 6C:
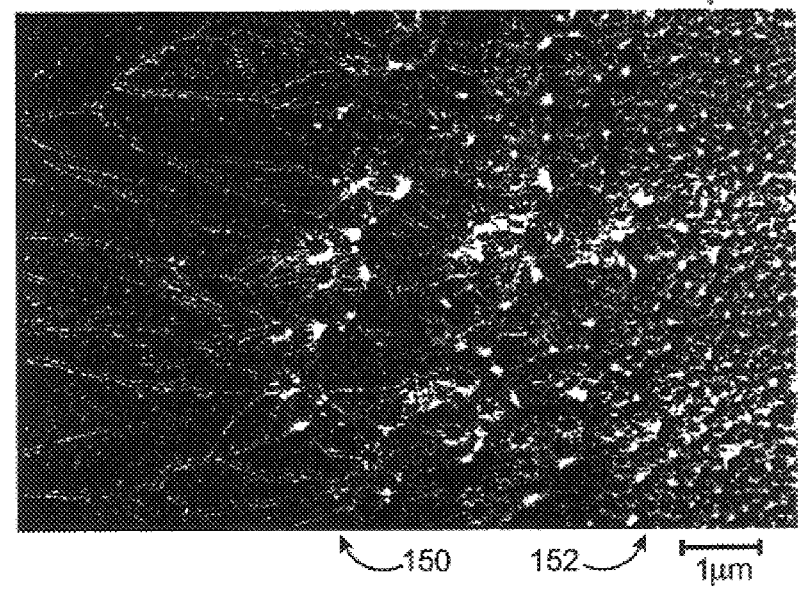

FIGS. 6A–6C show scanning electron micrograph (SEM) images of samples annealed under slightly different conditions than shown in prior FIGS. 5A–5C. Specifically, an excimer laser beam of fluence 252 mJ/cm$^2$ was applied at the midpoint of a 4 ms pulse of Ar$^+$ laser radiation of power 957 mW. FIG. 6A is a large scale view, and FIGS. 6B and 6C are detailed views, of long crystal grain portion 150 and boundary 104e between long grain crystal portion 150, and surrounding microstructure 152. Microstructure 152 lying outside laterally grown grains 150 comprises microcrystalline silicon where the excimer laser pulse has fully melted the amorphous silicon sample. The elliptical shape of laterally grown grains 150 reflects suppression of spontaneous nucleation by the heating induced by exposure to the Ar$^+$ laser beam. This nucleation suppression entrains laterally grown grains which meet at the center. The length of laterally grown grains is around 13 $\mu$m.

Figure 7A:
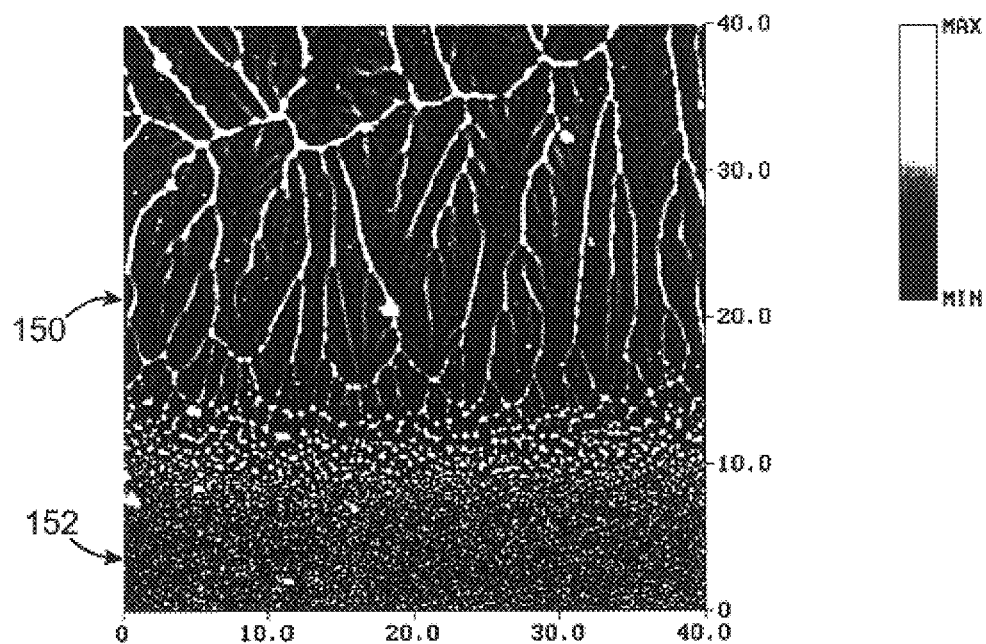
FIGS. 7A ad 7B show two- and three-dimensional atomic force microscope images respectively, of the boundary between the long grain polycrystalline silicon and the surrounding microstructure.
Figure 7B:
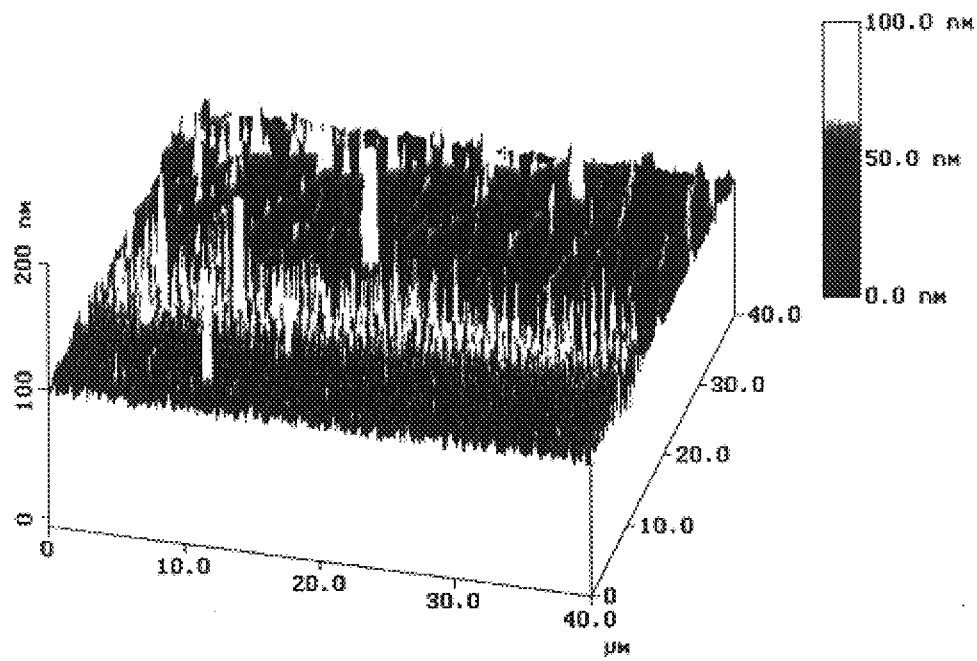

Atomic force microscopy confirms the topography revealed in FIGS. 5A–C and 6A–C above. FIG. 7A shows two-dimensional topography of the interface between long grain polycrystalline silicon 150 and the surrounding microstructure 152. FIG. 7B shows three-dimensional topography of the interface between long grain polycrystalline silicon 150 and the surrounding microstructure 150.

Figure 8A:
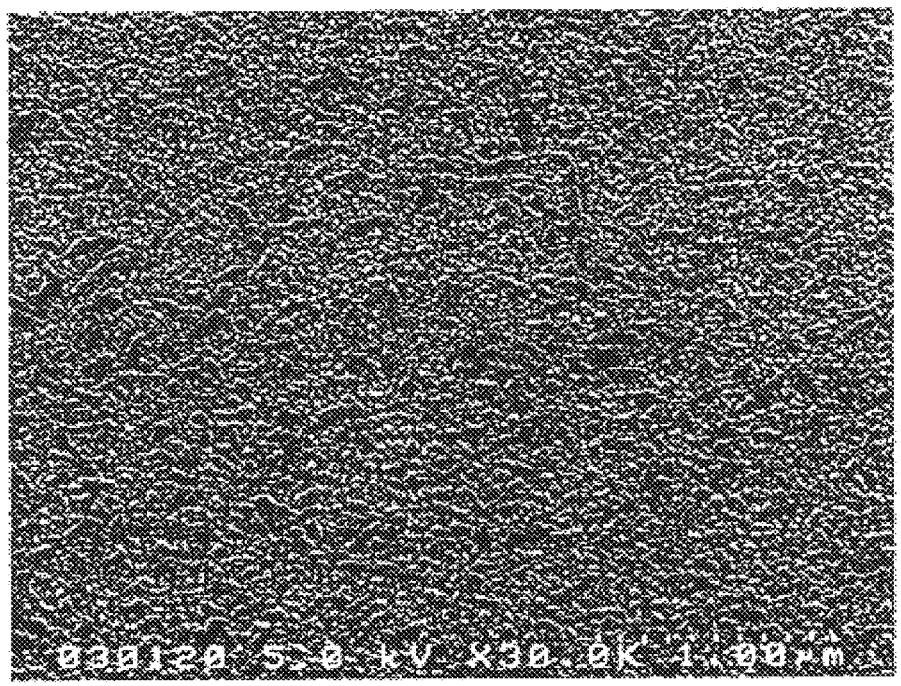
FIGS. 8A and 8B show SEM images of polycrystalline silicon formed by application of only Ar⁺ laser pulses.
Figure 8B:
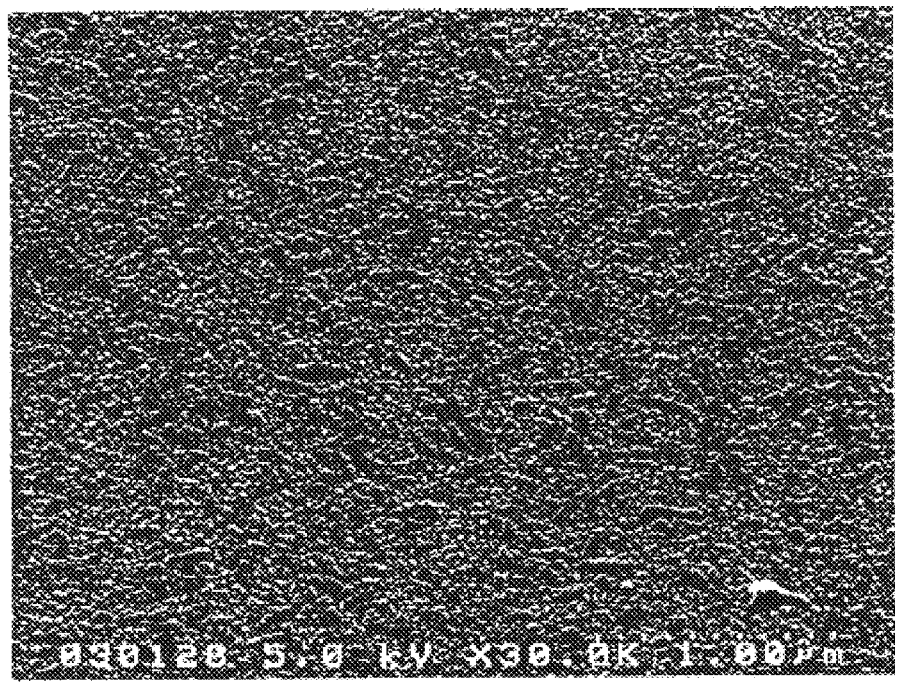

To further investigate the role of the Ar$^+$ laser in the crystallization process, the sample was annealed with only Ar$^+$ laser beams of various pulse lengths. Results are presented in FIGS. 8A and 8B for pulse lengths of 5 and 2 ms, respectively. Both samples exhibit microcrystalline structure indicative of partially molten amorphous silicon films. This further indicates that application of the Ar$^+$ laser beam heats up the amorphous silicon sample prior to application of the excimer laser pulse. Subsequent to application of the excimer laser pulse, the Ar$^+$ laser beam sustains molten phase Si. This suppresses spontaneous nucleation in the supercooled liquid Si surrounding the melt after expiration of the second laser pulse.

Figure 9:
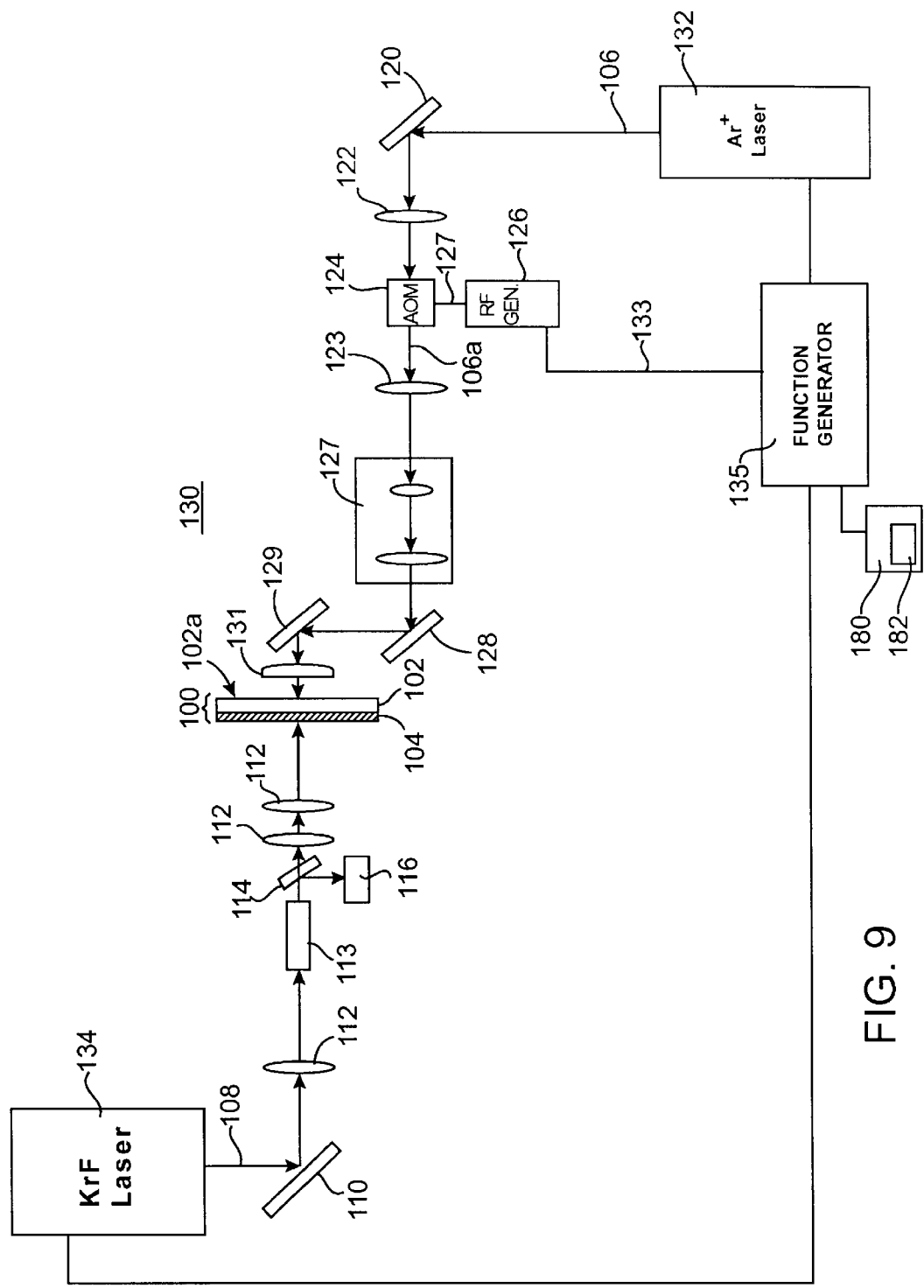
FIG. 9 shows one embodiment of a simplified apparatus for performing laser annealing in accordance with the present invention.

FIG. 9 depicts one embodiment of an apparatus for performing laser annealing of amorphous silicon in accordance with the present invention. Laser annealing apparatus 130 includes first continuous wave Ar$^+$ laser 132 and second pulsed KrF excimer laser 134.

First Ar$^+$ laser 132 emits first laser beam 106 at a wavelength of 532 nm. First laser beam 106 is delivered by mirror 120 and lens 122 to acousto-optic modulator (AOM) 124, at which first beam 106 is subjected to temporal modulation. This modulation of first laser beam 106 is necessary to prevent excessive heating and damage of optically transparent substrate 102 during the annealing process. Radio-frequency (RF) generator 126 provides RF signals 127 to AOM 124 when TTL signal 133 is received from function generator 135, thereby defining the pulse width of diffracted first laser beam 106a emanating from AOM 124.

Diffracted first laser beam 106a is delivered to back side 102a of optically transparent substrate 102 by lens 123, beam expander 127, mirror 128, dichoric mirror 129, and cylindrical lens 131. Cylindrical lens 131 imparts an elliptical cross-sectional profile to diffused second laser beam 106a.

KrF excimer laser 134 emits second laser beam 108 at a wavelength of 248 nm. Second laser beam 108 is delivered to amorphous silicon film 104 through mirror 110, lenses 112, and beam homogenizer 113. Second laser beam 108 is split at beam splitter 114 to permit energy meter 116 to measure the energy of beam 108.

Timing of application of energy from excimer laser 134 and Ar$^+$ laser 132 is accomplished by function generator 136. Function generator 135 is in electrical communication with both excimer laser 134 and Ar$^+$ laser 132, and also with RF generator 126. Function generator 135 thus synchronizes the superpositioned application of laser energy to sample 100, as well as temporal modulation of first laser beam 106.

Controller 180 controls operation of laser annealing apparatus 130 by executing instructions stored in memory 182 in computer readable format. Controller 180 is in electrical communication with, and exerts control over function generator 135. In this manner, controller 180 determines the timing of application of laser energy to the sample.

Figure 10A:
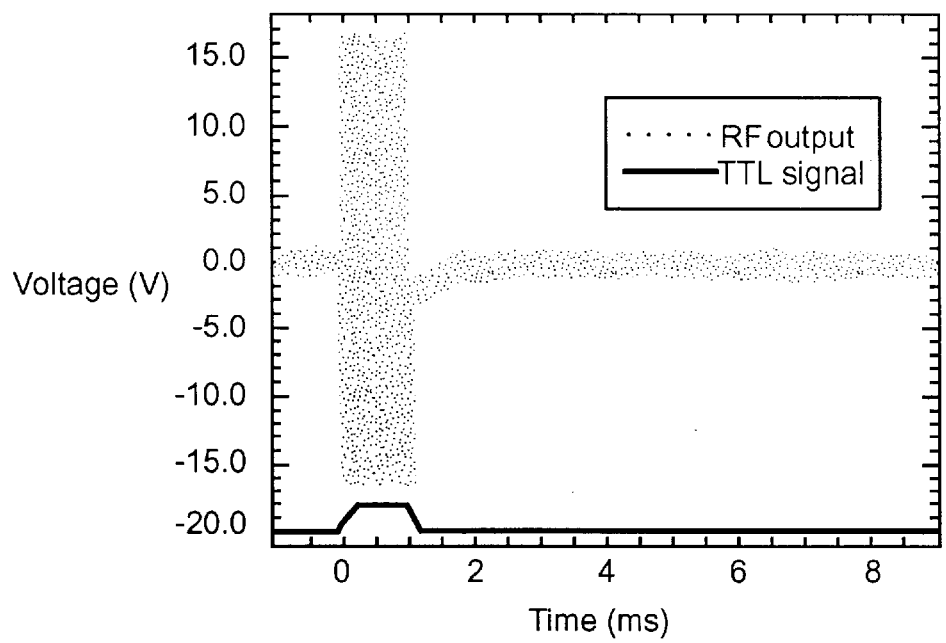
FIG. 10A shows variation of the RF signal with respect to the TTL signal measured by an oscilloscope for the simplified apparatus shown in FIG. 9.
Figure 10B:
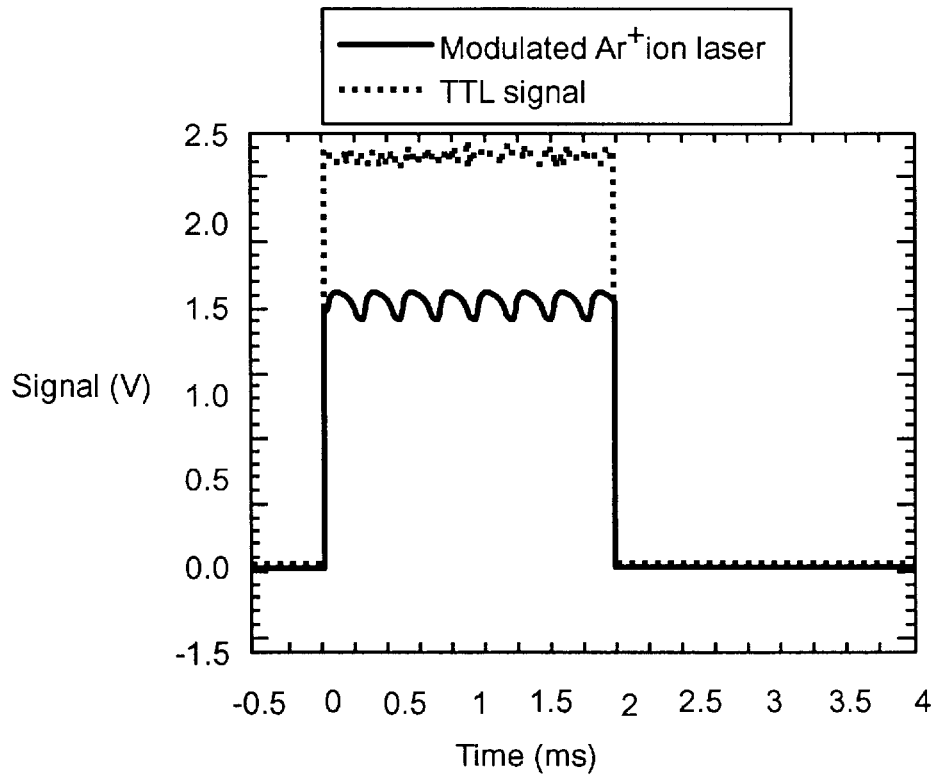
FIG. 10B shows the Ar⁺ laser pulse captured by a Si-detector and recorded by an oscilloscope for the simplified apparatus shown in FIG. 9.

FIG. 10A shows variation in RF signal 127 output from RF generator 126 with respect to TTL signal 133 output from function generator 135, as measured by an oscilloscope. FIG. 10B shows the resulting 2 ms Ar$^+$ laser pulse captured by a Si-detector and recorded by an oscilloscope. The measured delay between generation of a pulse generator fire signal by function generator 135 and actual irradiation of sample 100 by excimer laser 134 is about 1.8 $\mu$s, with a standard deviation of 0.203 $\mu$s. Given the 4 ms pulse duration of the first laser beam as shown in FIG. 2, this delay between firing signal and irradiation can therefore be considered negligible.

The method and apparatus for crystallizing amorphous silicon in accordance with the present invention offers a number of advantages over existing techniques.

For example, conventional laser annealing of amorphous silicon often relies upon shaping of the laser beam intensity profile via beam masks, interference, or phase shift masks, all of which are difficult, expensive, and time-consuming to create. Other conventional approaches to laser annealing utilize patterned islands, antireflective coatings, and sample preheating at elevated temperatures, which also require time and effort and can increase defect rates.

By contrast, laser annealing in accordance with one embodiment of the present invention utilizes a much simpler, non-intrusive method that simply requires synchronized application of a second laser beam rather than fabrication of any particular mask structure over the amorphous silicon.

Another advantage of laser annealing in accordance with one embodiment of the present invention is a departure from cumbersome and inefficient shaping of large area illumination. Conventional laser annealing techniques suffer from instability in laser energy from pulse-to-pulse, necessitating slow scanning and irradiation over multiple pulses which can give rise to variation in the uniformity and size of the crystals grown. These limitations reduce processing speed and hinder practical integration of conventional laser annealing into a process flow.

By contrast, laser annealing in accordance with one embodiment of the present invention is relatively insensitive to typical variation in the character of the applied laser beams. This is shown below by FIGS. 11A and 11B.

Figure 11A:
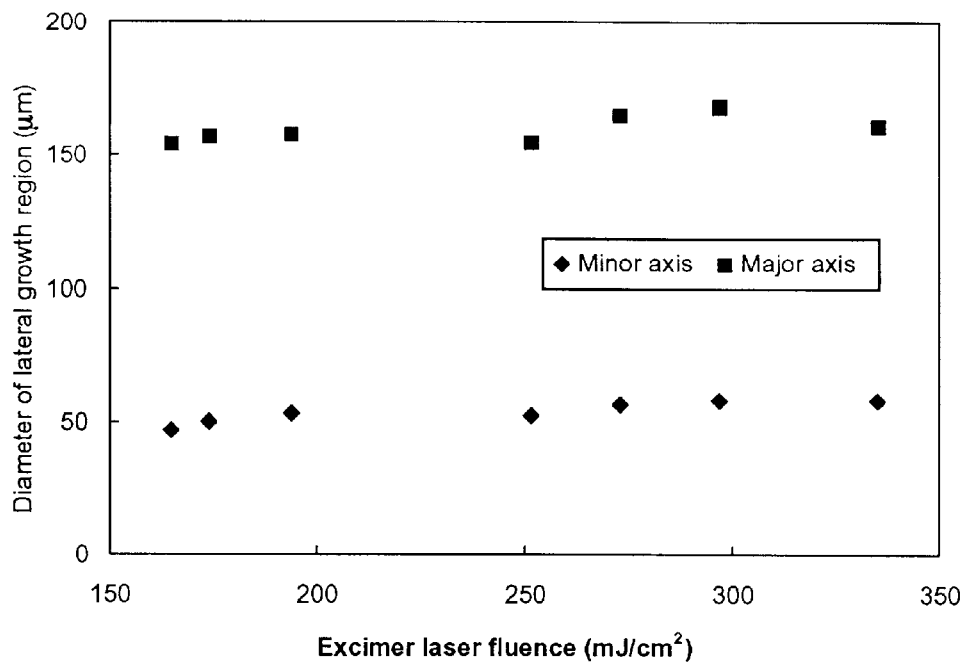
FIG. 11A plots the width of the long p-Si grain growth region versus fluence of the excimer laser.

FIG. 11A plots the width of the long polycrystalline silicon grain growth region versus fluence of the excimer laser, with the excimer laser pulse occurring at the midpoint of a 4 ms pulse of an $Ar^+$ laser having a power of 945 mW. FIG. 11A shows relatively small change in the major and minor axes of the long crystalline region over a broad range of excimer laser fluences.

Figure 11B:
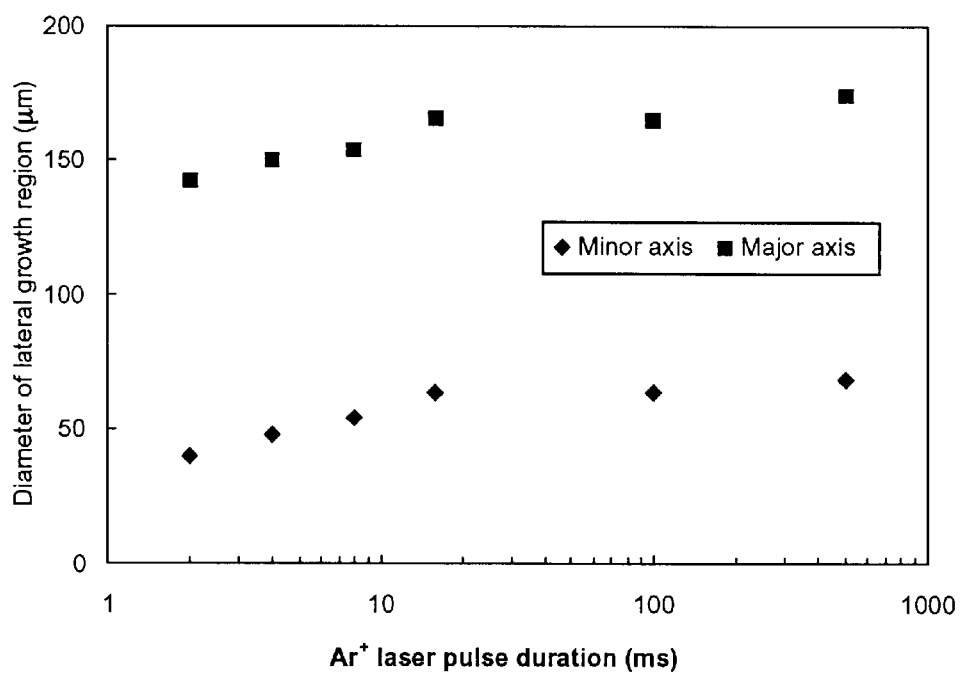
FIG. 11B plots the width of the long p-Si grain growth region versus duration of application of the Ar⁺ laser.

FIG. 11B plots the width of the long polycrystalline silicon grain growth region versus duration of application of the $Ar^+$ laser pulse, with an excimer laser pulse of fluence of 200 $mJ/cm^2$ occurring at the midpoint of the pulse of an $Ar^+$ laser having a power of 930 mW. FIG. 11B also shows relatively small change in the size of the long crystalline region along the major and minor axes over a variety of durations of $Ar^+$ laser pulses.

Yet a further advantage of the present method is control over both the length and directionality of crystal growth. Conventional laser annealing techniques do not permit prolonged exposure of the amorphous silicon to the laser beam, resulting in only a relatively brief period of heating and consequently formation of polycrystalline silicon exhibiting only a small grain size. However, formation of large-grained polycrystalline silicon in accordance with the present invention is due to the first modulated beam pulse creating a gradient distribution in the amorphous silicon and that maintains melting. This combination suppresses nucleation and enables prolonged periods of crystal growth to occur, resulting in elongated crystals.

The present method also permits control over the directionality of growth of the crystal grains. As described extensively above, crystal growth is initiated at nucleation sites on the periphery of the molten region, followed by extension of the crystal grains toward the center of the molten region. By controlling the position and/or shape of the superpositioned laser beams, and hence the location of the molten region in relation to a target, directionality of crystal grain growth can be controlled. Exercise of control over the directionality of crystal growth, and hence the orientation of grain boundaries, is also discussed further in detail below in conjunction with scanning of the laser beams and/or physical translation of the sample.

Laser annealing in accordance with one embodiment of the present invention is suited for a wide variety of applications.

Figure 12:
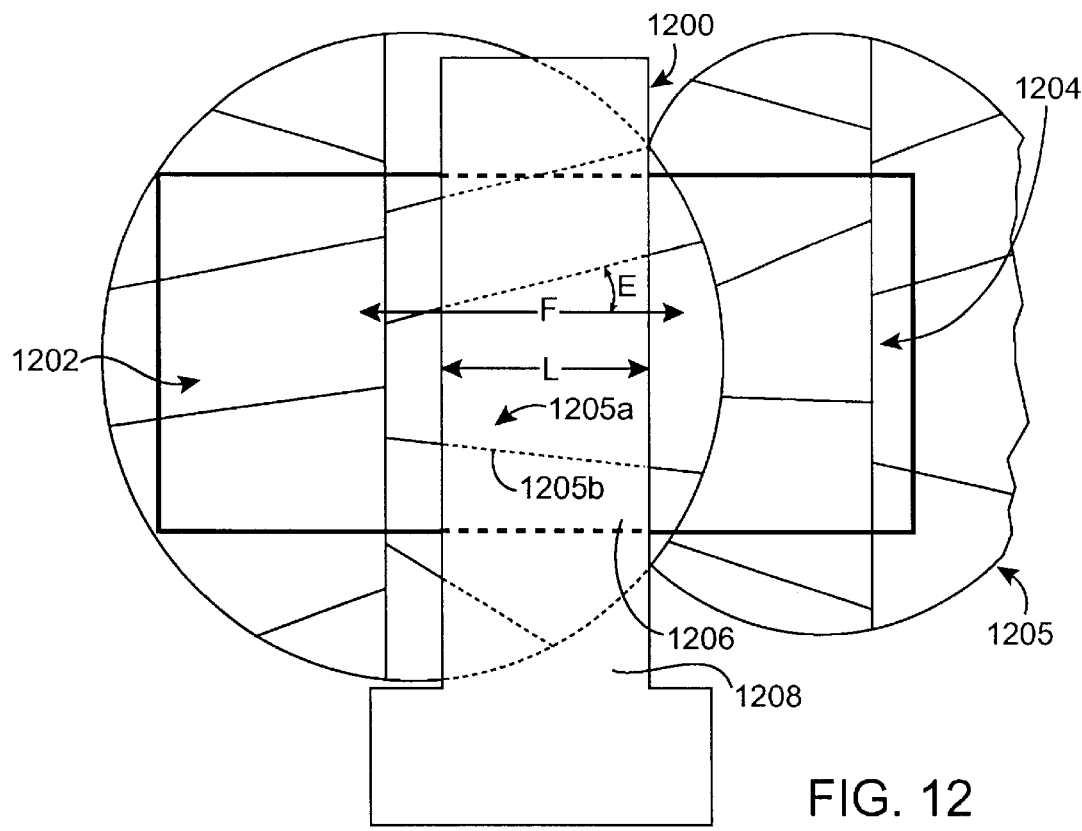
FIG. 12 shows a simplified plan view of one embodiment of a TFT structure formed by the method in accordance with the present invention.

One application is in the fabrication of a p-Si TFT. FIG. 12 shows a plan view of such a TFT device 1200 comprising source 1202 and drain 1204 separated by channel 1206 of length L. Source 1202, drain 1204, and channel 1206 are formed from a polycrystalline silicon layer 1205 having elongated grains 1205*a* produced by one embodiment of the method in accordance with the present invention. Gate 1208 overlies channel 1206 and is separated from the underlying channel by a gate dielectric.

Upon application of a potential difference between source 1202 and drain 1204, and between gate 1208 and source 1202, charge can be conducted across channel 1206. However, the precise operation of the p-Si TFT device is highly dependent upon the electrical conduction characteristics of the channel region 1206.

Where the channel region is composed of a plurality of smaller crystals, the grain boundaries between the crystals will impede movement of charge carriers across the channel, and the p-Si TFT device will operate at slower switching speeds and require larger applied voltages.

However, where the channel region is composed of high quality, long grain polycrystalline silicon, charges passing between the source and drain will encounter few, if any, polycrystalline silicon grain boundaries and therefore experience low sheet resistance. The p-Si TFT will thus operate with rapid switching speeds at low applied voltages, with high reliability and with high uniformity.

Accordingly, it is a goal of the present invention to fabricate a p-Si TFT device such that a longer grain crystalline region fabricated by laser annealing of amorphous silicon in accordance with the present invention extends at least the length of the channel. This is shown in FIG. 12, wherein single, elongated polycrystalline silicon grains 1205*a* extend across entire length L of channel 1206.

As shown in FIG. 12, grains 1205*a* have an average size of more than 10 $\mu$m, but the invention is not limited to producing grains having these dimensions. Longer or smaller gain sizes are possible, and tailoring of the grain size and hence TFT channel length could permit p-Si TFT devices to be utilized in large scale integration (LSI) circuits that conventionally require the use of MOS or bipolar transistor devices.

As described above, the dimensions of longer grain polycrystalline region 1206 are largely dictated by the cross-sectional area of the first applied laser beam. However, where the width of the applied beam is narrower than the projected channel length, it is still possible to fabricate the TFT device utilizing the present invention.

Specifically, the laser beams could be scanned for a short distance across the material layer between pulse events. This would create overlapping elongated crystalline regions and further extend the length of the grains. In an alternative embodiment, the sample itself could be physically translated between superpositioned irradiation events to permit growth of crystals of greater length. In such an embodiment, the crystal would grow in a direction opposite the movement of the sample. In yet another alternative approach, the sample and laser beams could each be translated at slightly offset speeds to create elongated polycrystalline silicon grains.

Utilizing either stationary or translated samples or beams, as shown in FIG. 12 the direction of boundaries 1205*b* of polycrystalline silicon grains 1205*a* could be limited to some maximum angle E (E$\leq$45°) from axis F between source 1202 and drain 1204.

Figure 13:
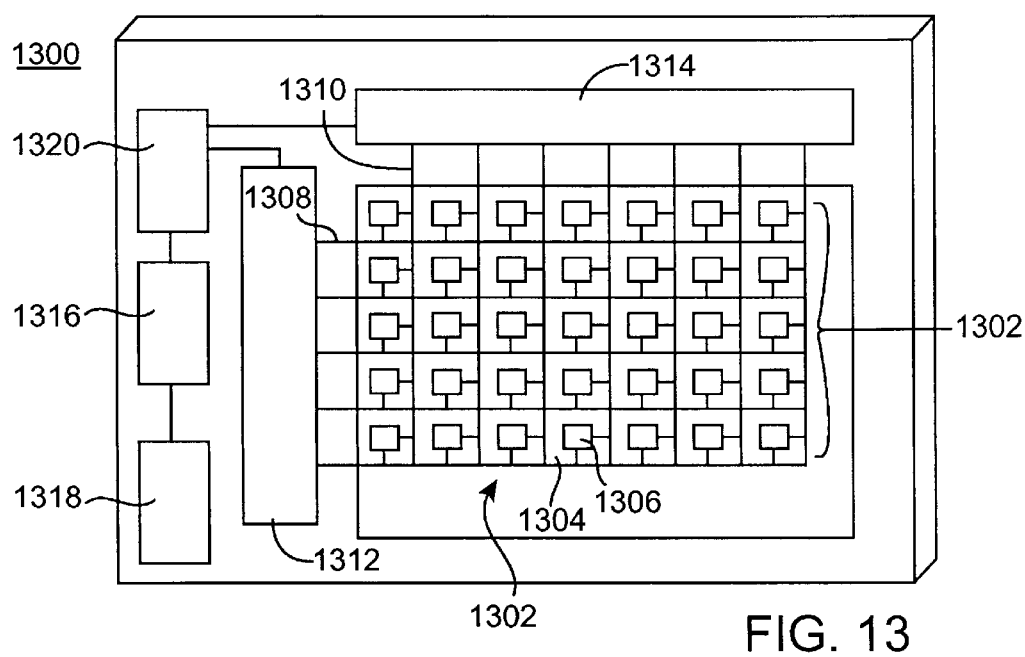
FIG. 13 shows one embodiment of a simplified flat panel display device formed by the method in accordance with the present invention.

FIG. 13 shows a flat panel display device incorporating p-Si TFT structures fabricated utilizing the method in accordance with the present invention. Display device 1300 includes array 1302 of discrete pixels 1304. Each pixel 1304 is controlled by p-Si TFT 1306 fabricated utilizing an embodiment of the present method. Each p-Si TFT is individually addressable along one of row lines 1308 and column lines 1310. Row driver structure 1312 is in electrical communication with row lines 1308. Column driver structure 1314 is in electrical communication with column lines 1310.

Display 1300 further includes memory structure 1316, sensor structure 1318, and controller structure 1320. Controller structure 1320 is in electrical communication with row driver 1312 and column driver 1314, and controls the application of voltages to individually addressable TFTs 1306.

The method for forming large-grain polycrystalline silicon films in accordance with one embodiment of the present invention can be used to fabricate the source, drain, and channel regions of TFT transistors 1306 controlling individual pixels 1304. The present method can also be utilized to fabricate electronic circuits 1312, 1314, 1316, 1318, and 1320 that are peripheral to pixels 1304 of array 1302.

Although the present invention has been described above in connection with specific embodiments, it must be understood that the invention as claimed should not be limited to these embodiments. Various modifications and alterations in the disclosed methods and apparatuses will be apparent to those skilled in the art without departing from the scope of the present invention.

For example, while the method and apparatus of present invention is described above in connection with applying superimposed laser beams to opposite sides of a film of amorphous silicon, the present invention is not limited to such an approach. The superpositioned laser beams in accordance with the present invention could be delivered to the same side of a sample, and the method and apparatus would remain within the scope of the present invention.

In addition, while the embodiments described above show formation of polycrystalline silicon from amorphous silicon, the present invention is not limited to annealing this type of amorphous material. Application of superpositioned laser beams could be utilized to transform a variety of materials from one state to another. Materials eligible for transformation in accordance with the present invention include but are not limited to semiconductor materials, dielectric materials, and conductive materials. Specific examples of materials that could be transformed from one state to another include silicon-germanium, indium-antimony, and silicon nitride and silicon oxide films.

Moreover, while the embodiments described above utilize laser beams from different sources ($Ar^+$ and KrF excimer lasers) this is not required by the present invention. A method or apparatus for laser annealing could utilize a single laser source having its beam split and the respective parts applied to the sample at different times and for different durations, and the method or apparatus would fall within the scope of the present invention.

In addition, while the embodiments described above depict application of energy from the second laser beam at the midpoint of the duration of exposure of the first laser beam, the present invention is not limited to this timing sequence. Application of the first laser beam to the sample could be timed to expire at the same time as application of the second laser beam, and the method and apparatus would remain within the scope of the present invention. In such an embodiment, maintenance of the temperature gradient and suppression of nucleation leading to elongated crystal growth would be provided by the slower cooling of the higher temperature silicon previously exposed to energy from both the first laser beam and the second laser beam.

And while the embodiments described above utilize pulse durations on the order of milliseconds for the first laser pulse and on the order of nanoseconds for the second laser pulse, this is also not required by the present invention. A method could utilize first and second pulse durations of any length, so long as the pulses are superpositioned and some delay period exists between commencement of the first laser pulse and the second laser pulse. Preferably however, the first pulse duration is at least 100 nanoseconds and the second pulse duration is less than 100 nanoseconds.

Furthermore, the present invention is not limited to annealing amorphous silicon utilizing laser energy. Energy from sources other than lasers could be applied to melt and recrystallize amorphous material in the manner just described. Such alternative energy sources include but are not limited to electron beams and ion beams. Application of energy from such sources would be timed to melt and then recrystallize the sample material as described extensively above.

In addition, while the above description illustrates application of a first pulse from a CW laser beam having a Gaussian cross-sectional intensity distribution, this is also not required by the present invention. Laser beams having other cross-sectional profiles, such as top hat-like or another beam shape, could also be utilized to fabricate polycrystalline silicon in accordance with the present invention.

In addition, the intensity of the modulated CW laser beam could be variable in time. The rising and falling time of the first beam intensity may be controlled with a precision on the order of nanoseconds. The cooling rate of the liquid silicon, the solidification rate of the liquid silicon, and the duration of melting determine the growth of polycrystalline silicon grains. Therefore, the variation in laser intensity over time is an effective parameter to control the polycrystalline silicon structures.

Furthermore, the shape of the focused CW laser beam could be spatially modified to promote crystal growth. Thus instead of the cylindrical cross-sectional profile shown above, the CW beam could have a variety of shapes depending upon the requirements of a particular application. In such an embodiment, the shape of the applied beam would in turn determine the shape of the nucleation site.

Yet still further, the method in accordance with one embodiment of the present invention could be combined with the use of seed crystals to promote crystallization. A seed crystal could be introduced into the amorphous silicon prior to superpositioned laser annealing in several possible ways. One method of forming a seed crystal would be by solid phase crystallization such as metal-induced crystallization or germanium-induced crystallization. Alternatively, another form of laser recrystallization could be employed. Use of seed crystals would be effective to control location and orientation of the p-Si grains ultimately produced using the present invention.

Yet still further, focused micro-spots from solid state lasers could be used instead of the large spot area excimer laser beam. The use of multiple solid state lasers having smaller beam cross-sections would decrease the cost of the method and increase throughput by reducing dependence upon a single laser source.

Yet still further, delivery of the laser beams to the sample could be accomplished with micro-optics, including MEMS scale devices. Examples of delivery optics structures formed by micro-fabrication processes and available for use with the present invention include, but are not limited to, lenses, mirrors, and beam splitters.

Yet still further, utilization of multiple and high-repetition beams could dramatically increase the fabrication speed and efficiency in a massively parallel system. Such alternative embodiments would encompass splitting a single beam into a large number of parts applied independently to the substrate, and would permit the irradiation of large areas of substrate more rapidly than with a single beam.

Yet still further, beam alignment and on-line probing schemes could be developed and integrated in the process in order to enhance process repeatability, stability, reliability and robustness. Micro-optics including MEMS scale devices can be used for the system.

Yet still further, while the method in accordance with one embodiment of the present invention has been described so far primarily in connection with the formation of a p-Si TFT structure, the present invention is not limited to this application. Superpositioned laser annealing of amorphous material could be employed to create optical memory storage devices, such as DVD disks. In such an embodiment, selective superpositioned laser annealing would create regions of large-grained polycrystalline material representing bits of information.

Having fully described several embodiments of the present invention, many other equivalent or alternative methods and apparatuses for fabricating long crystal polycrystalline silicon according to the present invention will be apparent to those skilled in the art. These alternatives and equivalents are intended to be included within the scope of the present invention.

What is claimed is:

1. A thin film transistor comprising a source, a drain, and a channel, the channel positioned between the source and drain and comprising polycrystalline silicon formed from amorphous silicon by application of a first energy beam to an amorphous silicon film and application of a superpositioned second energy beam to the amorphous silicon film for a second duration occurring within the first duration.

2. The thin film transistor of claim 1 wherein the channel comprises an average polycrystalline grain size of greater than 10 $\mu$m.

3. The thin film transistor of claim 2 wherein a grain boundary of the polycrystalline grain is oriented at an angle of 75° or less relative to an axis between the source and drain.

4. The thin film transistor of claim 1 wherein a length of the channel is formed by a single polycrystalline silicon grain.

* * * * *